(12) United States Patent
Takemae

(10) Patent No.: US 8,431,965 B2
(45) Date of Patent: Apr. 30, 2013

(54) CONTROL CIRCUIT OF TRANSISTOR AND METHOD

(75) Inventor: Yoshihiro Takemae, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/310,144

(22) Filed: Dec. 2, 2011

(65) Prior Publication Data

US 2012/0218009 A1    Aug. 30, 2012

(30) Foreign Application Priority Data

Feb. 25, 2011 (JP) .................................. 2011-039549

(51) Int. Cl.
*H03K 17/284* (2006.01)
*G05F 1/575* (2006.01)

(52) U.S. Cl.
USPC .... 257/194; 257/386; 257/488; 257/E29.246; 327/109; 327/520; 327/566

(58) Field of Classification Search .................. 257/194, 257/386, 488, E29.246; 327/109, 520, 566
See application file for complete search history.

(56) References Cited

PUBLICATIONS

Saito, Wataru "Field-Plate Structure Dependence of Current Collapse Phenomena in High-Voltage GaN-HEMTs", IEEE Election device, vol. 31, No. 7. Jul. 2010, pp. 659-661.

*Primary Examiner* — Evan Pert
(74) *Attorney, Agent, or Firm* — Fujitsu Patent Center

(57) ABSTRACT

A control circuit, which controls a transistor including a gate and a field plate, includes: a detecting circuit which detects a driving timing to drive the transistor; a timing controlling circuit which controls a first driving timing to drive the gate and a second driving timing to drive the field plate, in response to the driving timing; and a driving circuit which drives the gate in response to the first driving timing, and drives the field plate in response to the second driving timing.

16 Claims, 14 Drawing Sheets

US 8,431,965 B2

CONTROL CIRCUIT OF TRANSISTOR AND METHOD

CROSS-REFERENCE TO RELATED APPLICATION

This application is based upon and claims the benefit of priority of the prior Japanese Patent Application No. 2011-39549, filed on Feb. 25, 2011, the entire contents of which are incorporated herein by reference.

FIELD

The embodiments discussed herein are related to a control circuit of a transistor, a control system of a transistor, and a method for controlling a transistor.

BACKGROUND

A GaN-HEMT (high electron mobility transistor), which has high electric breakdown field intensity of GaN and high mobility of HEMT, has promise as a high power switching element. However, so as to be driven by a driving voltage at about 10 V generated by an IC (integrated circuit), an insulating layer of a GaN-HEMT between gate and channel is configured to be thin. Therefore, the gate of a GaN-HEMT is not sufficiently insulating. Also, as a large gate capacitance makes driving of a GaN-HEMT by an IC difficult, there is an upper limit to the channel length for a GaN-HEMT. As a result, a breakdown voltage of a GaN-HEMT between source and drain is no more than about 100 V.

Thus, a GaN-HEMT provided with a field plate (hereafter, referred to as "FP") is proposed so as to enhance the breakdown voltage (such a GaN-HEMT is referred to as a "GaN-FP-HEMT", hereafter). (For example, refer to Wataru Saito, "Field-Plate Structure Dependence of Current Collapse Phenomena in Hight-Voltage GaN-HEMTs", *IEEE Electron device*, Vol. 31, No. 7, pp. 659-661, July 2010.)

SUMMARY

According to the first aspect of the embodiments, a control circuit, which controls a transistor including a gate and a field plate, includes: a detecting circuit which detects a driving timing to drive the transistor; a timing controlling circuit which controls a first driving timing to drive the gate and a second driving timing to drive the field plate, in response to the driving timing; and a driving circuit which drives the gate in response to the first driving timing, and drives the field plate in response to the second driving timing.

According to the second aspect of the embodiments, a method, which is for controlling a transistor including a field plate and a gate, includes driving the field plate and the gate at different timings.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As GaN-FP-HEMT, a HEMT including a FP connected to a source and a HEMT including a FP connected to a gate are proposed. If a FP is connected to the source, the source potential is applied to the FP, and the ON-resistance tends to be high. As a result, power consumption of the GaN-HEMT including the FP connected to the source tends to be large.

On the other hand, if a FP is connected to the gate, the gate capacitance and the FP capacitance are driven together, and the switching speed of the GaN-HEMT including the FP connected to the gate tends to be slow.

Embodiment 1

(1) Structure

Figure 1:
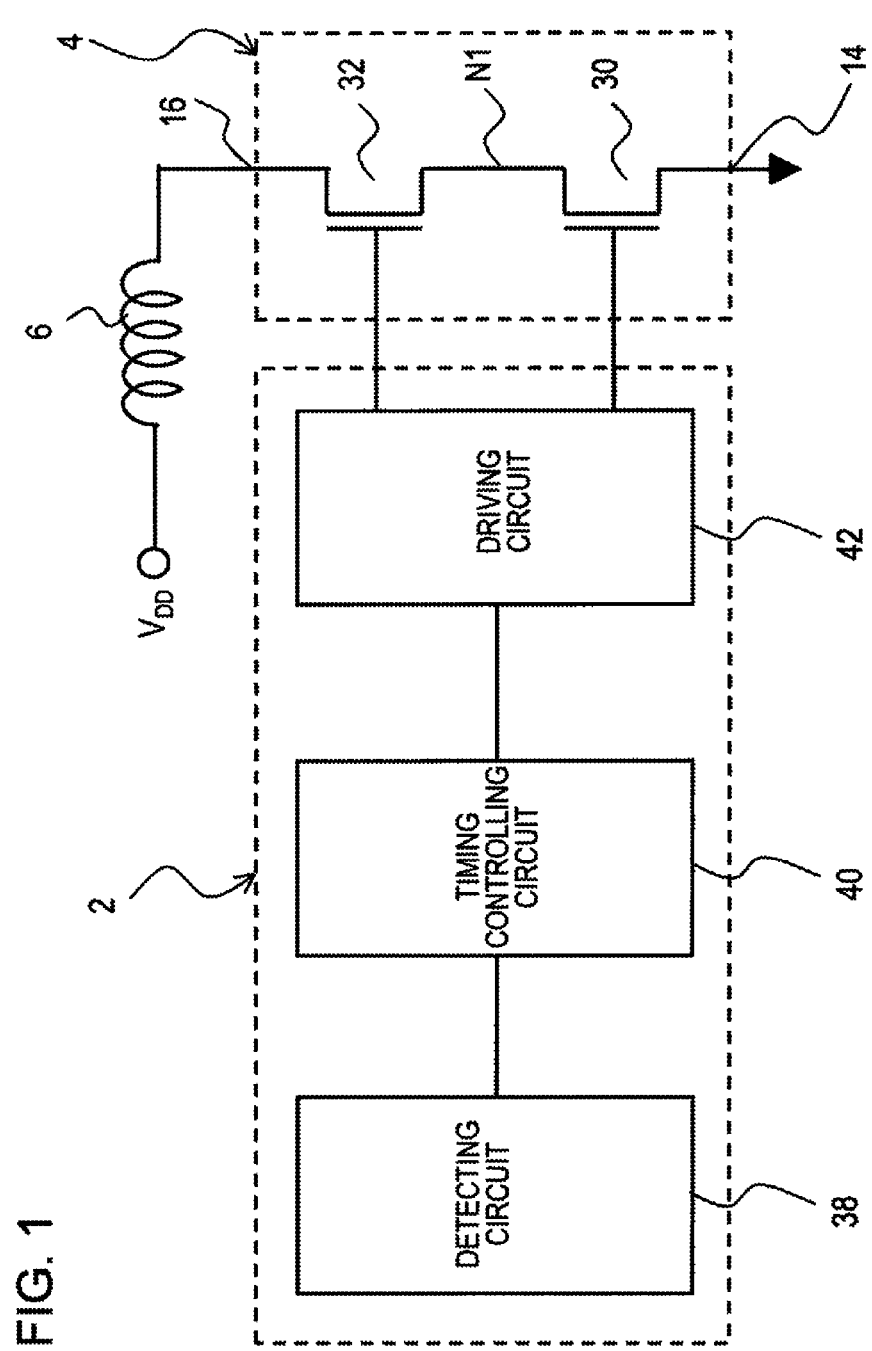
FIG. 1 is a structural drawing of a controlling device in accordance with Embodiment 1.
Figure 2:
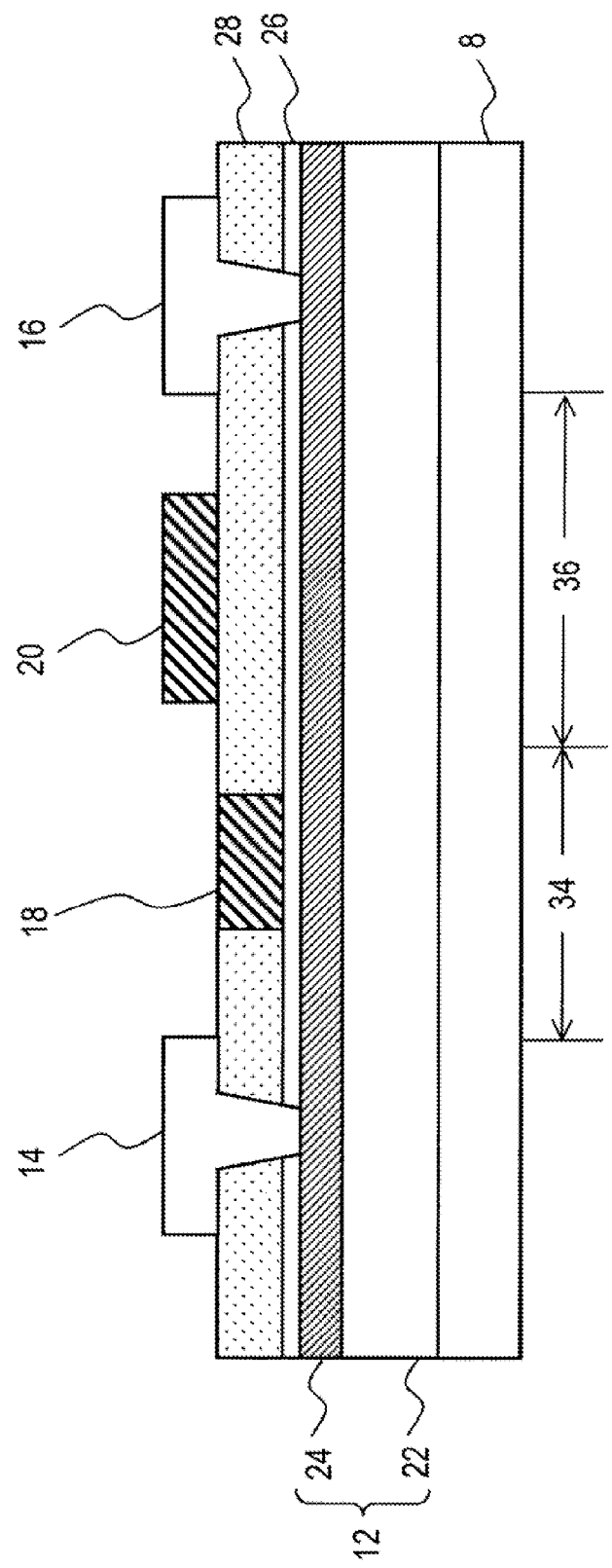
FIG. 2 is a cross-section drawing of transistor in accordance with Embodiment 1.

FIG. 1 is a structural drawing of a controlling apparatus (circuit) 2 in accordance with the present embodiment. In FIG. 1, together with the controlling apparatus 2, a transistor 4 which the controlling apparatus 2 controls, and a load inductor 6 of the transistor 4 are illustrated. The load inductor 6 is, for example, a element included in a power system. FIG. 2 is a cross-section drawing of the transistor 4.

As illustrated in FIG. 2, the transistor 4 is a GaN-HEMT formed on a Si substrate 8. This GaN-HEMT includes an AlGaN/GaN heterostructure 12, a source electrode (hereafter, referred to as a source) 14, a drain the electrode (hereafter, referred to as a drain) 16, a gate 18, and a FP 20.

The AlGaN/GaN heterostructure 12 includes an undope GaN layer 22 and an AlGaN barrier layer 24. By lattice distortion occurring between the AlGaN barrier layer 24 and the GaN 22, a piezoelectric polarization occurs. By this piezoelectric polarization and an intrinsic polarization, two-dimensional electron gas is generated at the interface between the AlGaN barrier layer 24 and the GaN 22. Thereby, without doping n-type impurity to the AlGaN barrier layer 24, the two-dimensional electron gas is generated in the AlGaN/GaN heterostructure 12.

On the surface of the AlGaN/GaN heterostructure 12, a first insulating film 26 such as SiN is formed. On this first insulating film 26, the gate 18 is formed. Further, on the first insulating film 26, a second insulating film 28 such as $SiO_2$ film or the like is formed. On this second insulating film 28, an FP 20 is formed. The source 14 and the drain 16 are formed so that the gate 18 and the FP 20 are put between them.

The gate 18 and heterostructure 12 thereby (including the insulating film 26,28) operate as a HEMT transistor. Also, the FP 20 and heterostructure 12 thereby (including the insulating film 26,28), operate as a HEMT transistor. Therefore, as illustrated in FIG. 1, an equivalent circuit of the transistor 4 is a series circuit of a transistor 30 (hereafter, referred to as a "GaN-HEMT") corresponding to the gate 18, and a transistor 32 (hereafter, referred to as a "FP transistor") corresponding to the FP 20.

Here, the threshold value of GaN-HEMT 30 is, for example, approximately 1 to 3 V. On the other hand, the threshold value of the FP transistor 32 is, for example, approximately −40 V. That is, the transistor 4 in accordance with the present embodiment includes, as illustrated in FIG. 2, a first transistor region 34 having a positive threshold value voltage, and a second transistor region 36 serially connected to the first transistor region 34 and having a negative threshold value voltage.

The breakdown voltage (hereafter, referred to as the breakdown voltage) between the source and the drain of the GaN-HEMT 30 is, for example, approximately 100 V, and the breakdown voltage of the FP transistor 32 is sufficiently higher than the voltage of a constant voltage supply $V_{DD}$ (for example, 380 V). The difference between characteristics of the GaN-HEMT 30 and the FP transistor 32 (the threshold value, and the breakdown voltage) is caused by the difference between the thickness of the insulating film 26 beneath the gate 18 and the thickness of the insulating film 26, 28 beneath the FP 20.

The source 14 of the transistor 4 is, as illustrated in FIG. 1, connected to the ground. On the other hand, the drain of the transistor 4 is connected to one end of the load inductor 6. The other end of the load inductor 6 is connected to, for example, the constant voltage supply $V_{DD}$. To the GaN-HEMT 30 and the FP transistor 32, output of the control circuit 2 is supplied. Further, the one end of the load inductor 6 above is connected, for example, to a diode included in the power system.

the controlling apparatus 2 includes, as illustrated in FIG. 1, a detecting circuit 38, a timing controlling circuit 40, and a driving circuit 42. The detecting circuit 38 measures a power-supply voltage generated by the power system (not illustrated), and detects a timing to drive the transistor 4. On the basis of this result, a PWM signal is generated, ON/OFF of the transistor 4 is controlled, and an objective voltage is obtained.

In response to the timing to drive the transistor 4, the timing controlling circuit 40 controls the first driving timing to drive the gate 18 and the second driving timing to drive the FP 20. This second driving timing is a timing occurring at a different time from the first driving timing.

The driving circuit 42 drives the gate 18 in response to the first driving timing, and drives the FP 20 in response to the second driving timing.

Further, the detecting circuit 38 generates the termination timing to terminate the driving of the transistor 4. In response to this timing to terminate the driving of the transistor 4, the timing controlling circuit 40 controls the first termination timing to terminate the driving of the gate 18 and the second termination timing to terminate the driving of the FP 20. The second termination timing is a timing occurring at a different time from the first termination timing.

The driving circuit 42 terminates the driving of the gate 18 in response to this first termination timing, and terminates the driving of the FP 20 in response to the second termination timing.

(2) Operation

Figure 3:
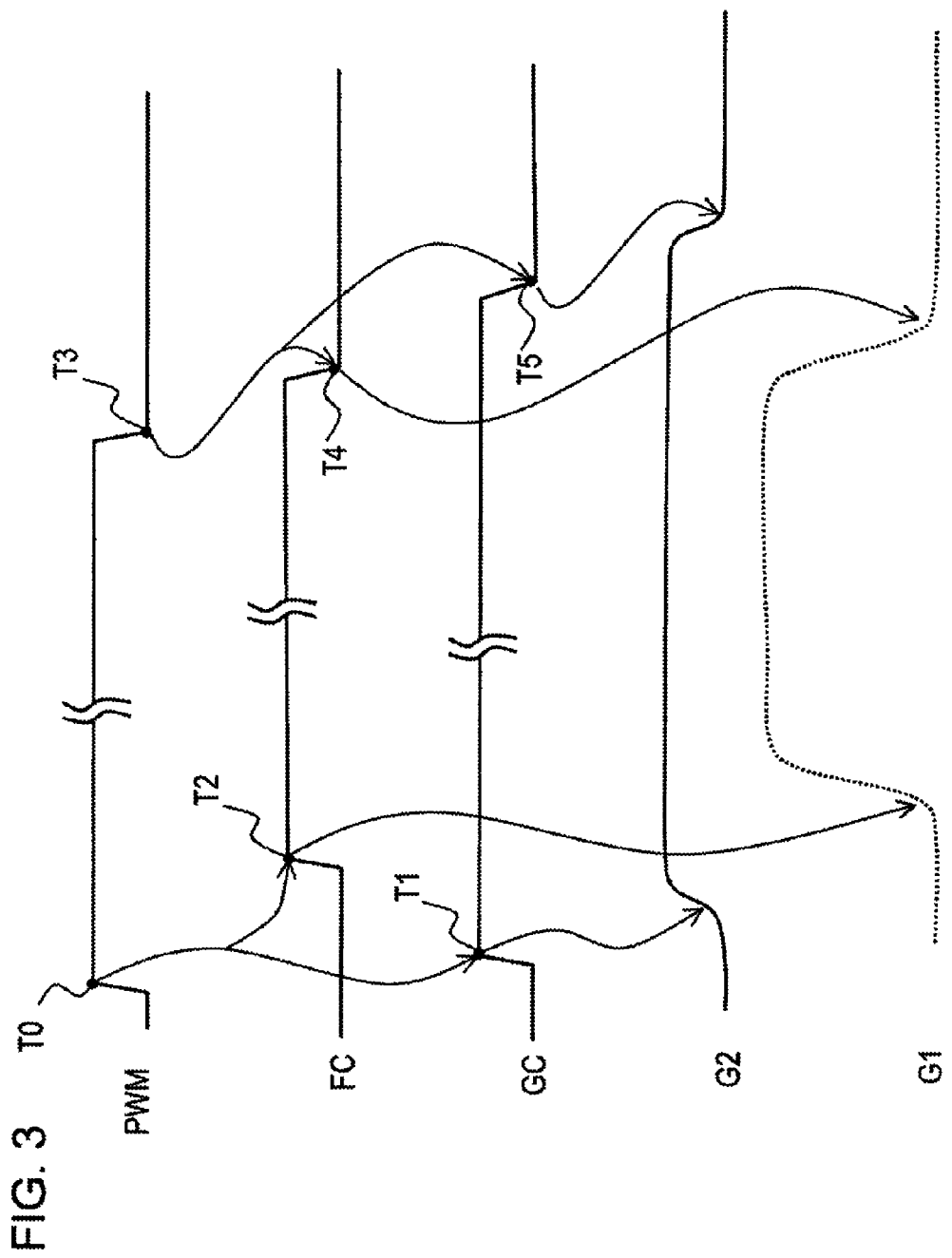
FIG. 3 is a time-chart illustrating an operation example of a control circuit.

FIG. 3 is a time chart illustrating an operation example of the control circuit 2. The horizontal axis represents time. The vertical axis represents voltage. The detecting circuit 38 monitors an external signal and detects a timing for driving the transistor 4. The detecting circuit 38 generates the timing generating pulse, in response to the detected timing. For example, the detecting circuit 38 detects a timing at which the voltage of the external signal becomes lower than the reference voltage, and generates a PWM (Pulse Width Modulation) pulse in response to the detected timing.

As illustrated in FIG. 3, the timing controlling circuit 40 generates an FP controlling pulse FC and a gate controlling pulse GC, in response to a rising timing T0 of the PWM pulse. Here, the rising timing of the pulse is a time within a rising edge of the pulse (for example, the time when the pulse rises as high as 90% of the peak value).

The driving circuit 42 generates a gate driving pulse G2, in response to a rising timing T1 of the gate controlling pulse GC. The gate 18 is driven by this gate driving pulse G2. Also, the driving circuit 42 generates an FP driving pulse G1, in response to a rising timing T2 of the FP controlling pulse FC. The FP 20 is driven by this FP driving pulse G1. By a series of these operations, the transistor 4 is made to be conductive.

Also, the timing controlling circuit 40 terminates the gate controlling pulse GC and the FP controlling pulse FC, in response to a falling timing T3 of the PWM pulse. The driving circuit 42 terminates the FP driving pulse G1, in response to a falling timing T4 of the FP controlling pulse FC. Also, the driving circuit 42 terminates the gate driving pulse G2, in response to a falling timing T5 of the gate controlling pulse GC. By a series of these operations, the transistor 4 is made to be non-conductive. Here, the falling timing of the pulse is a time within the falling edge of the pulse (for example, the time at which the pulse falls as low as 10% of the peak value).

Such an operation of the controlling apparatus 2 is explained from a viewpoint of sequence of timings. The detecting circuit 38 detects, for example, the timing at which the voltage of the external signal becomes equal to or less than the reference voltage. The detecting circuit 38 generates the rising timing T0 of the PWM pulse, in response to this timing detected.

The timing controlling circuit 40 generates the rising timing T1 of the gate controlling pulse GC (the first driving timing) and the rising timing T2 of the FP controlling pulse FC (the second driving timing), in response to the rising timing T0.

The driving circuit 42 generates the gate driving pulse G2, in response to the rising timing T1 of the gate controlling pulse GC, and drives the gate 18. Also, the driving circuit 42 generates the FP driving pulse G1, in response to the rising timing T2 of the FP controlling pulse FC, and drives the FP 20. Thereby, the transistor 4 is made to be conductive. Here, the rising timing T2 of the FP controlling pulse FC is a timing, which occurs later than the rising timing T1 of the gate controlling pulse GC.

As the above, by the sequence of timings starting from a timing, which the detecting circuit 38 detects, the transistor 4 is driven. Therefore, the timing, which the detecting circuit 38 detects, is the timing for driving the transistor. Also, the timing, which the detecting circuit 38 detects, is the timing for making the transistor conductive.

Also, the detecting circuit 40 adjusts the width of the PWM pulse, according to, for example, the difference between the voltage of the external signal and the reference voltage. That is, the detecting circuit 40 generates the falling timing T3 of the PWM pulse.

The timing controlling circuit 40 generates the falling timing T4 of the FP controlling pulse FC (the second termination timing) and the falling timing T5 of the gate controlling pulse GC (the first termination timing), in response to the falling timing T3.

The driving circuit 42 terminates the FP driving pulse G1, in response to the falling timing T4 of the FP controlling pulse FC. That is, the driving circuit 42 terminates the driving of the FP 20. Also, the driving circuit 42 terminates the gate driving pulse G2, in response to the falling timing T5 of the gate controlling pulse GC. That is, the driving circuit 42 terminates the driving of the gate 18. Thereby, the transistor 4 is made to be non-conductive. Here, the falling timing T5 of the gate controlling pulse GC is a timing, which occurs later than the falling timing T4 of the FP controlling pulse FC.

As the above, by sequence of the timings, which start from the falling timing T3 of the PWM pulse, the driving of the transistor 4 is terminated. Therefore, the falling timing T3 of the PWM pulse is the timing for terminating the driving of the transistor 4. Also, the falling timing T3 of the PWM pulse is the timing for making the transistor 4 non-conductive.

Figure 4:
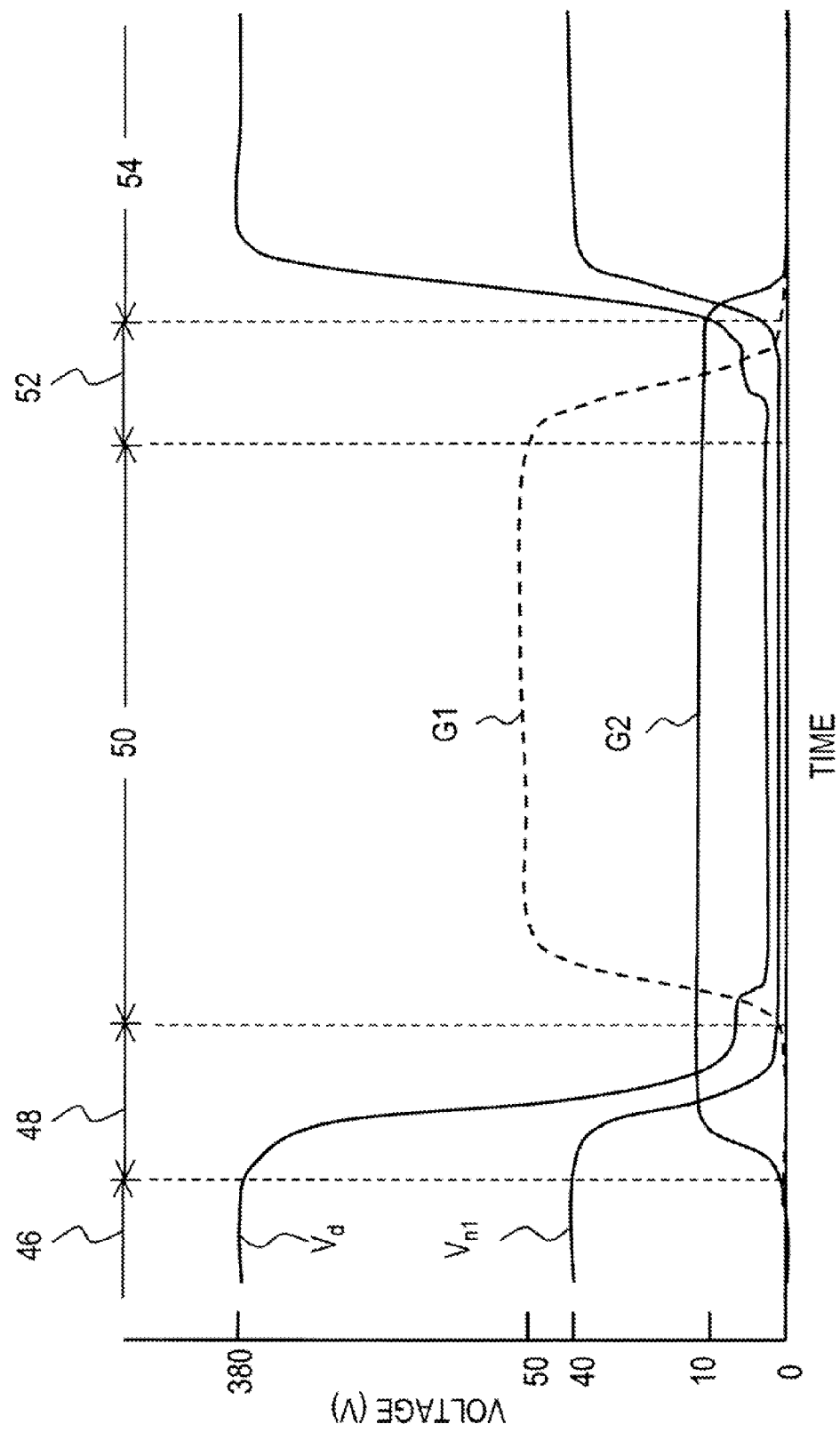
FIG. 4 is a drawing for illustrating an operation example of a transistor in accordance with Embodiment 1.

FIG. 4 is a drawing for illustrating an operation example of the transistor 4. The horizontal axis represents time. The vertical axis represents voltage. In FIG. 4, a temporal change Vd of the drain potential of the transistor 4 and the temporal change Vn1 of the potential at a node N1 are illustrated. The node N1 is, as illustrated in FIG. 1, the node between the GaN-HEMT 30 and the FP transistor 32. Also, in FIG. 4, the FP driving pulse G1 provided to the FP 20 and the gate driving pulse G2 provided to the gate 18 are illustrated. In an example illustrated in FIG. 4, a voltage $V_{DD}$ provided to the load inductor 6 is 380 V.

Operations of the transistor 4 are explained in terms of four periods. The first period 46 is a period before the gate driving pulse G2 and the FP driving pulse G1 are provided. The gate potential and the potential of the FP (hereafter, referred to as a "FP potential") of the first period 46 are, for example, 0 V (the potential of the source 14). The GaN-HEMT 30 is non-conductive, since the gate potential is equal to or less than the threshold value (1-3 V). Thereby, the potential of the node N1 rises to a voltage slightly higher than the absolute value of the threshold value of the FP transistor 32, and the FP transistor 32 is made to be non-conductive.

For example, if the threshold value of the FP transistor 32 is −40 V, the potential of the node N1, which is denoted by Vn1, becomes slightly higher than 40 V, and the FP transistor 32 is made to be non-conductive. As such, since the potential of the node N1 becomes lower than the voltage of the input power supply (for example, 380 V), the dielectric breakdown of GaN-HEMT 30 does not occur.

The second period 48 is a period in which the gate driving pulse G2 starts to be provided. In the second period 48, the gate potential rises, for example, from 0 V to 10 V. On the other hand, the FP potential remains at, for example, around 0 V. In response to the rise of the gate potential, the GaN-HEMT 30 is firstly made to be conductive. Thereby, the potential Vn1 of the node N1 falls to nearly 0 V, and the voltage of the FP 20 with respect to the node N1 rises, for example, from −40 V to 0 V. As a result, the FP transistor 32 is made to be conductive as well, and the drain potential Vd falls. However, since the ON-resistance of the FP transistor 32 does not sufficiently fall, the drain potential Vd does not fall to nearly 0 V.

The third period 50 is a period in which the FP driving pulse G1 is provided to the FP 20. The FP potential rises, for example, from 0 V to 50 V. On the other hand, through the third period 50, the gate potential remains at, for example, 10 V. As such, while in the period 50, the FP 20 is driven by a voltage higher than the driving voltage of the gate 18. Therefore, the ON-resistance of the FP transistor 32 becomes sufficiently lower than that of the second period 48. As a result, the drain potential Vd becomes nearly 0 V, and the power consumption of the transistor 4 decreases.

The fourth period 52 is a period in which the providing of the FP driving pulse G1 is terminated before the gate driving pulse G2. The gate potential in the fourth period 52 is, for example, 10 V. The FP potential decreases, for example, from 50 V to 0 V (the potential of the source 14). In response to the decrement of the FP potential, the ON-resistance of the FP transistor 32 increases. However, since the gate potential is maintained equal to or more than the threshold value of the GaN-HEMT, the GaN-HEMT 30 and the FP transistor 32 are conductive.

The fifth period 54 is a period in which the providing of the gate driving pulse G2 is terminated. The gate potential in the fifth period 54 decreases, for example, from 10 V to 0 V. The FP potential remains at, for example, 0 V (the potential of the source 14). In response to the decrement of the gate the potential, the GaN-HEMT 30 is firstly made to be non-conductive. Thereby, the potential Vn1 of the node N1 rises, and the voltage of the FP 20 with regard to the node N1 becomes equal to or less than the threshold value of the FP 20. As a result, the FP transistor 32 is made to be non-conductive.

As illustrated in FIG. 4, in the present embodiment, the FP 20 and the gate 18 are driven at different timings. Therefore, the load on the driving circuit 42 is reduced. Thereby, the switching of the transistor 4 is speeded up. Incidentally, the capacitance value of the FP 20 is, for example, as a high as hundreds pF.

Also, in the present embodiment, a driving of the FP 20 starts after the driving of the gate 18 starts. Thereby, when the GaN-HEMT 30 transits from the non-conductive state to the conductive state (the second period 48), the potential Vn1 of the node N1 is not pulled up by the FP driving pulse G1, and thus the potential Vn1 of the node N1 does not rise. Therefore, the two-dimensional electrons are not excessively accelerated by the node potential Vn1, and thus the two-dimensional electrons are not injected into AlGaN barrier layer 24 or the insulating film 26. Thereby, the two-dimensional electrons are not trapped by the AlGaN barrier layer 24 or the insulating film 26, and thus the threshold value of the GaN-HEMT 30 is not changed.

When the GaN-HEMT 30 transits from the conductive state to the non-conductive state (at the beginning of the fifth period 54), the two-dimensional electrons going through the GaN-HEMT 30 are accelerated by the potential Vn1 of the node N1. In the present embodiment, the driving of the gate 18 terminates after the driving of the FP 20 terminates. Therefore, when the GaN-HEMT 30 transits from the conductive state to the non-conductive state, the potential Vn1 of the node N1 is not pulled by the FP 20 potential, and thus the potential Vn1 of the node N1 is not excessively raised. Therefore, in this case also, the two-dimensional electrons are not trapped by AlGaN barrier layer 24 or the insulating film 26, thus the threshold value of GaN-HEMT 30 is not changed.

Further, through the third period 50, the current flows through the GaN-HEMT 30. However, since the potential Vn1 of the node N1 is as low as a few volts, two-dimensional electrons are not trapped by the GaN barrier layer 24 or the insulating film 26.

Figure 5:
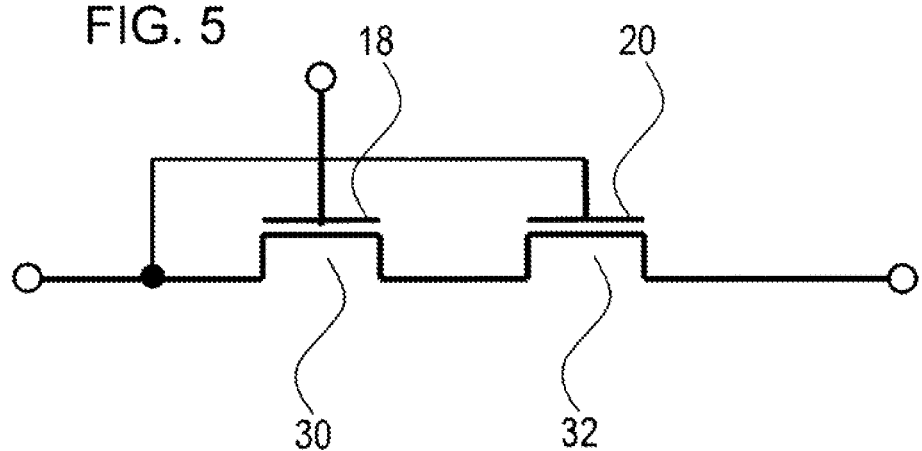
FIG. 5 illustrates an equivalent circuit of a transistor in which a FP is connected to the source of GaN-HEMT.

FIG. 5 illustrates an equivalent circuit of a transistor in which the FP 20 is connected to the source of the GaN-HEMT 30. In this transistor, even if the GaN-HEMT 30 is made to be conductive, the potential of the FP 20 remains at 0 V (the potential of the source 14). Therefore, the ON-resistance of the FP transistor 32 does not fall sufficiently low, and power consumption of the transistor tends to increase. On the other hand, in the present embodiment, since the ON-resistance of the FP transistor 32 decreases, a problem of this kind does not occur.

Figure 6:
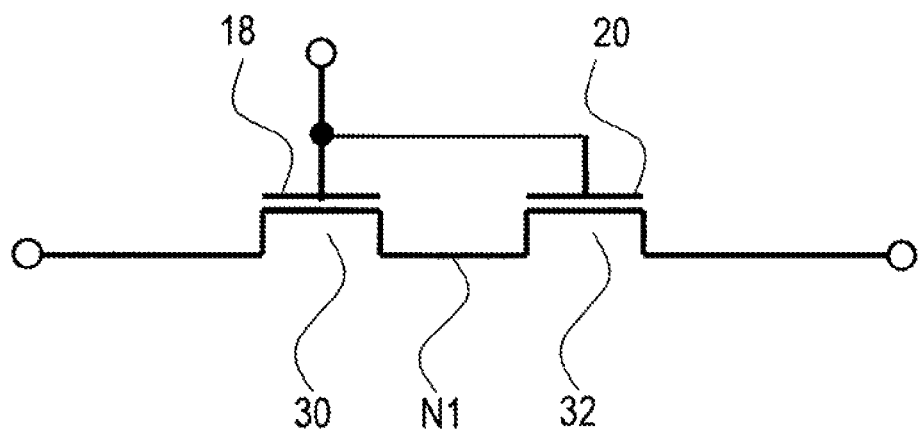
FIG. 6 illustrates an equivalent circuit of a transistor in which a FP is connected to the gate.

FIG. 6 illustrates an equivalent circuit of the transistor in which the FP 20 is connected to the gate 18. In this transistor, the gate 18 and the FP 20 are driven at the same time. Therefore, the load on the driving circuit 42 is large, and thus the switching of the transistor is difficult to speed up. Also, since the FP 20 is provided with the same driving voltage as that of the gate 18, when the GaN-HEMT 30 is made to be conductive, the drain potential of the GaN-HEMT 30 (the potential of the node N1) is raised by being pulled by the FP potential (the gate potential). Thereby, excessively accelerated two-dimensional electrons are trapped by the insulating film or the like immediately beneath the gate, thus the threshold value of the GaN-HEMT 30 is changed. On the other hand, in the present embodiment, since the FP 20 is driven after the gate 18 starts to be driven, a problem of this kind does not occur.

Also, when GaN-HEMT 30 is made to be non-conductive, the two-dimensional electron is trapped by the insulating film or the like immediately beneath the gate, thus the threshold value of GaN-HEMT 30 is changed. On the other hand, in the present embodiment, since the driving of the gate terminates after the driving of the FP30 terminates, a problem of this kind does not occur.

—Detecting Circuit—

Figure 7:
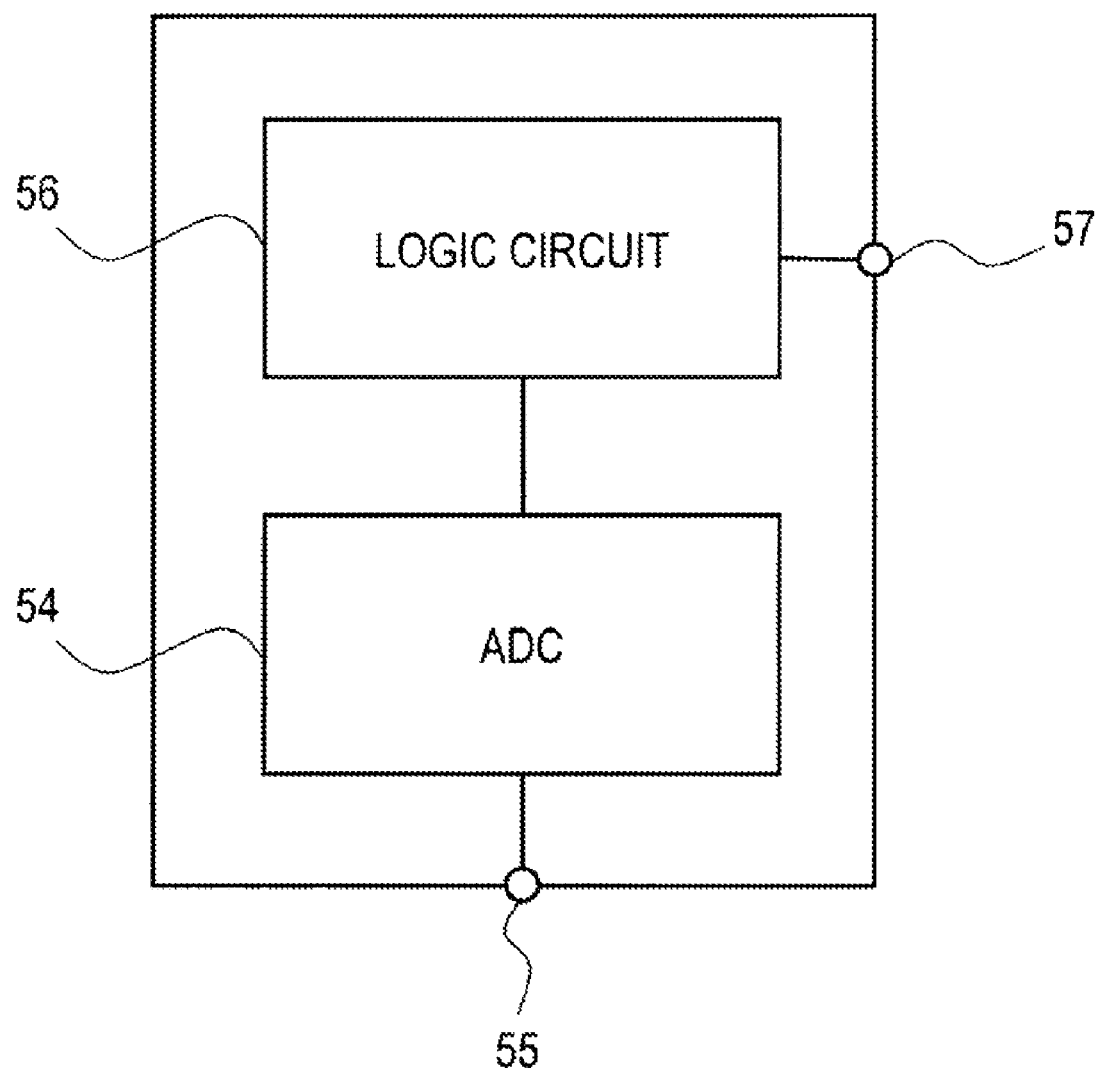
FIG. 7 illustrates an example of a structural drawing of a detecting circuit.

FIG. 7 is an example of a structural drawing of the detecting circuit 38. As illustrated in FIG. 7, the detecting circuit 38 includes an analog-to-digital converter 54 and a logic circuit 56. The logic circuit 56 includes, for example, an FPGA (Field-Programmable Gate Array). In the place of the logic circuit 56, a CPU (Central Processing Unit) and a memory which stores programs for making the CPU (Central Processing Unit) implement the function of the logic circuit 56 may be provided. This memory is used for computing processes performed by the CPU.

The analog-to-digital converter 54 performs an analog-to-digital conversion to an external signal which is provided to an external terminal 55, then data on the external signal are obtained and provided to the logic circuit 56. The logic circuit 56 generates a timing generating pulse (for example, a PWM pulse), on the basis of the obtained data on the external signal (for example, a voltage of the external signal). The timing generating pulse is provided to the timing controlling circuit 40 via an output terminal 57.

—Timing Controlling Circuit—

Figure 8:
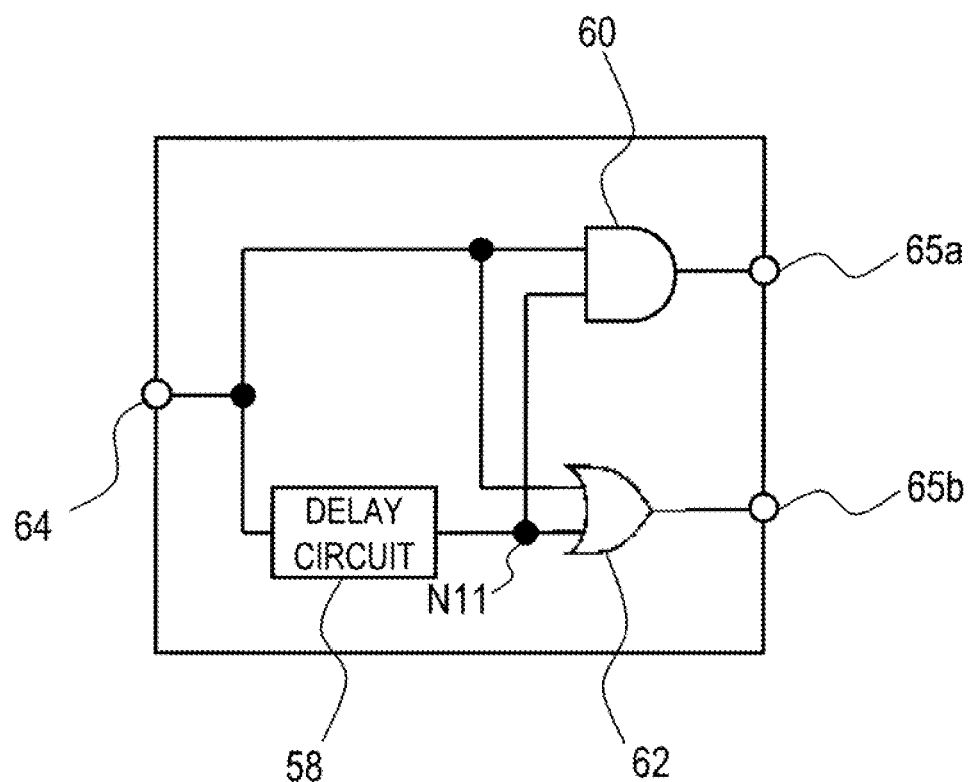
FIG. 8 illustrates an example of a structural drawing of a timing controlling circuit.
Figure 9:
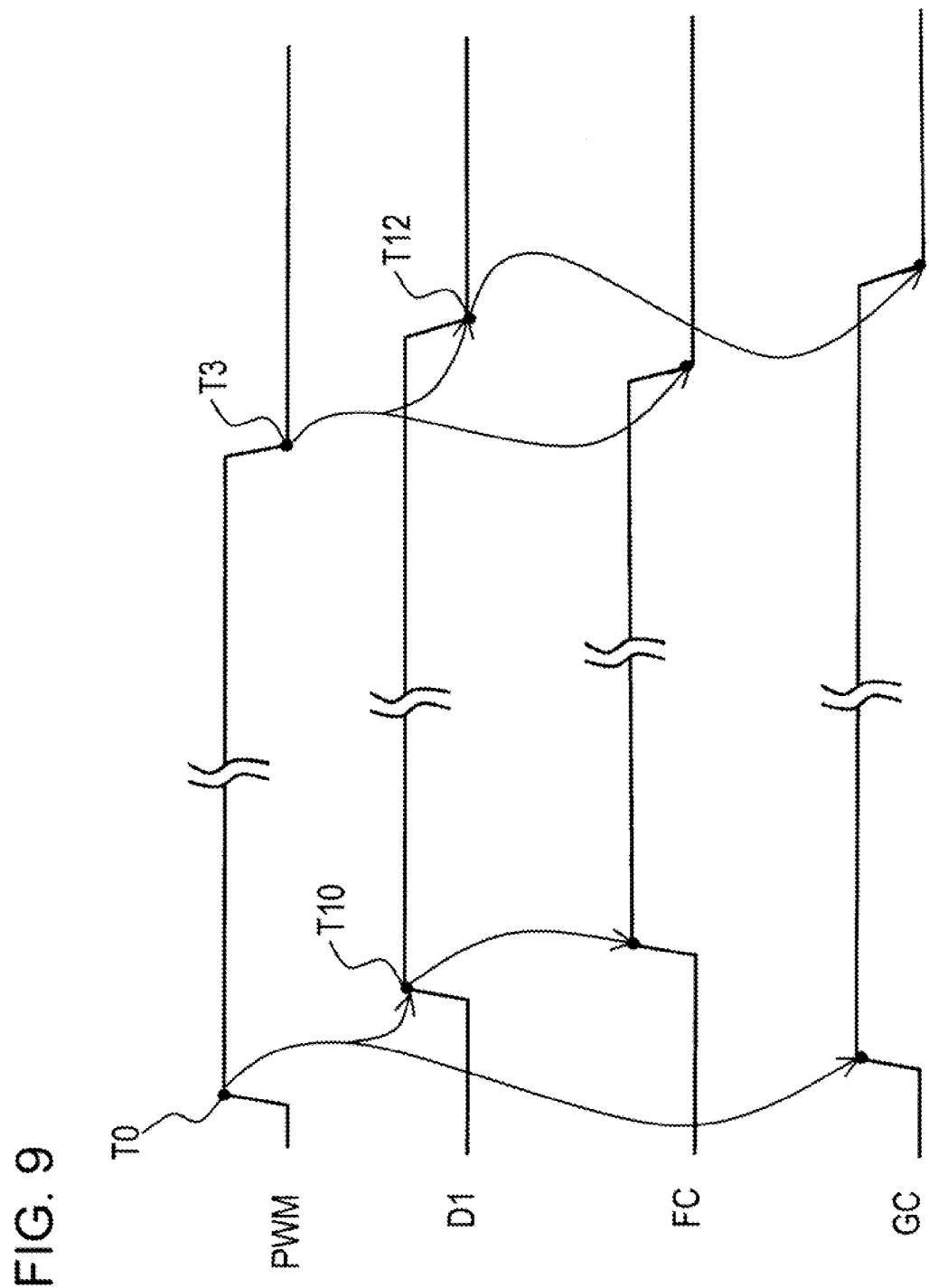
FIG. 9 is a time-chart illustrating an operation of the timing controlling circuit of FIG. 8.

FIG. 8 is an example of a structural drawing of the timing controlling circuit 40. FIG. 9 is a time-chart illustrating operations of the timing controlling circuit of FIG. 8. As illustrated in FIG. 8, this timing controlling circuit includes, for example, a delay circuit 58, an AND gate 60, and an OR gate 62.

As illustrated in FIG. 9, when the timing generating pulse (the PWM pulse in FIG. 9) is provided to the input terminal 64, the OR gate 62 generates the gate controlling pulse GC, in response to the rising timing T0 of the timing generating pulse. The generated gate controlling pulse GC is provided to the driving circuit 42 at the next stage, via a second output terminal 65b.

The delay circuit 58 generates a delay pulse D1, in response to the rising timing T0 of the timing generating pulse. The delay time is, for example, approximately 100 ns. In response to a rising timing T10 of this delay pulse D1, the AND gate 60 generates an FP controlling pulse FC. The generated FP controlling pulse FC is provided to the driving circuit 42 at the next stage, via a first output terminal 65a.

Thereafter, the timing generating pulse falls low. In response to the falling timing T3 thereof, the AND gate 60 terminates the FP controlling pulse FC. The delay circuit 58 terminates the delay pulse D1, in response to the falling timing T3 of the timing generating pulse. In response to a falling timing T12 of this delay pulse D1, the OR gate 62 terminates the gate controlling pulse GC.

Figure 10:
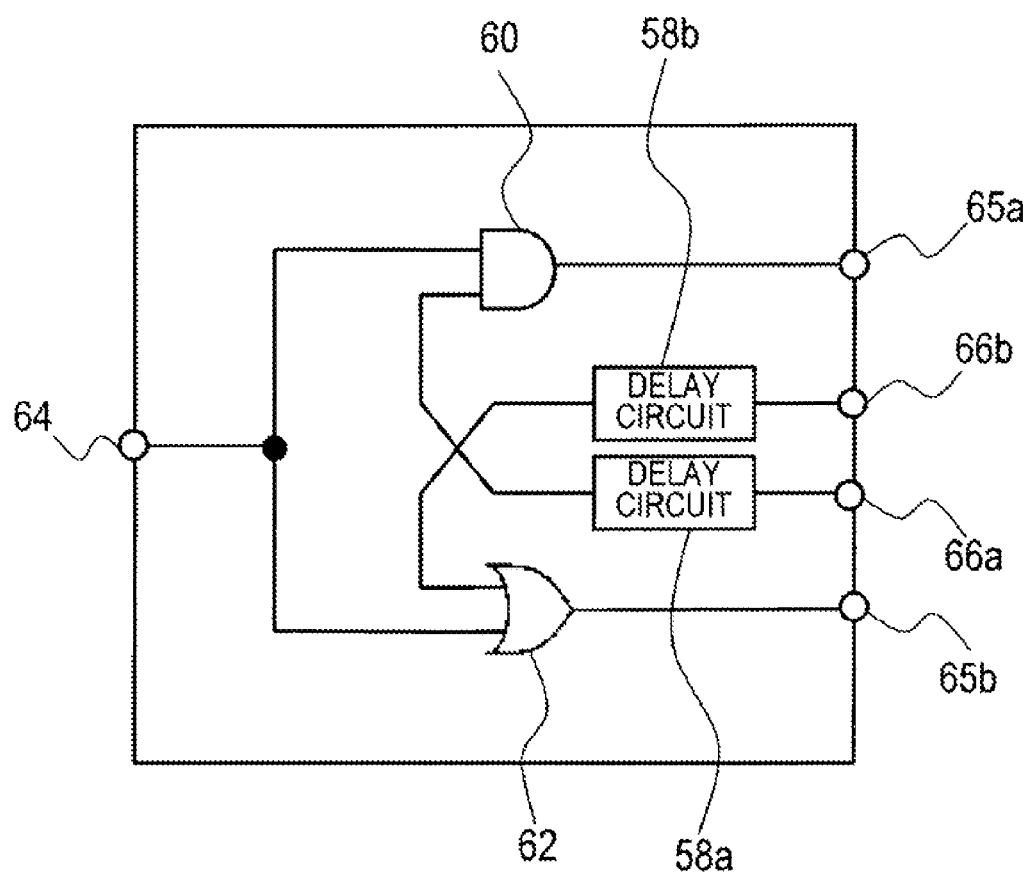
FIG. 10 is a structural drawing of other example of the timing controlling circuit.
Figure 11:
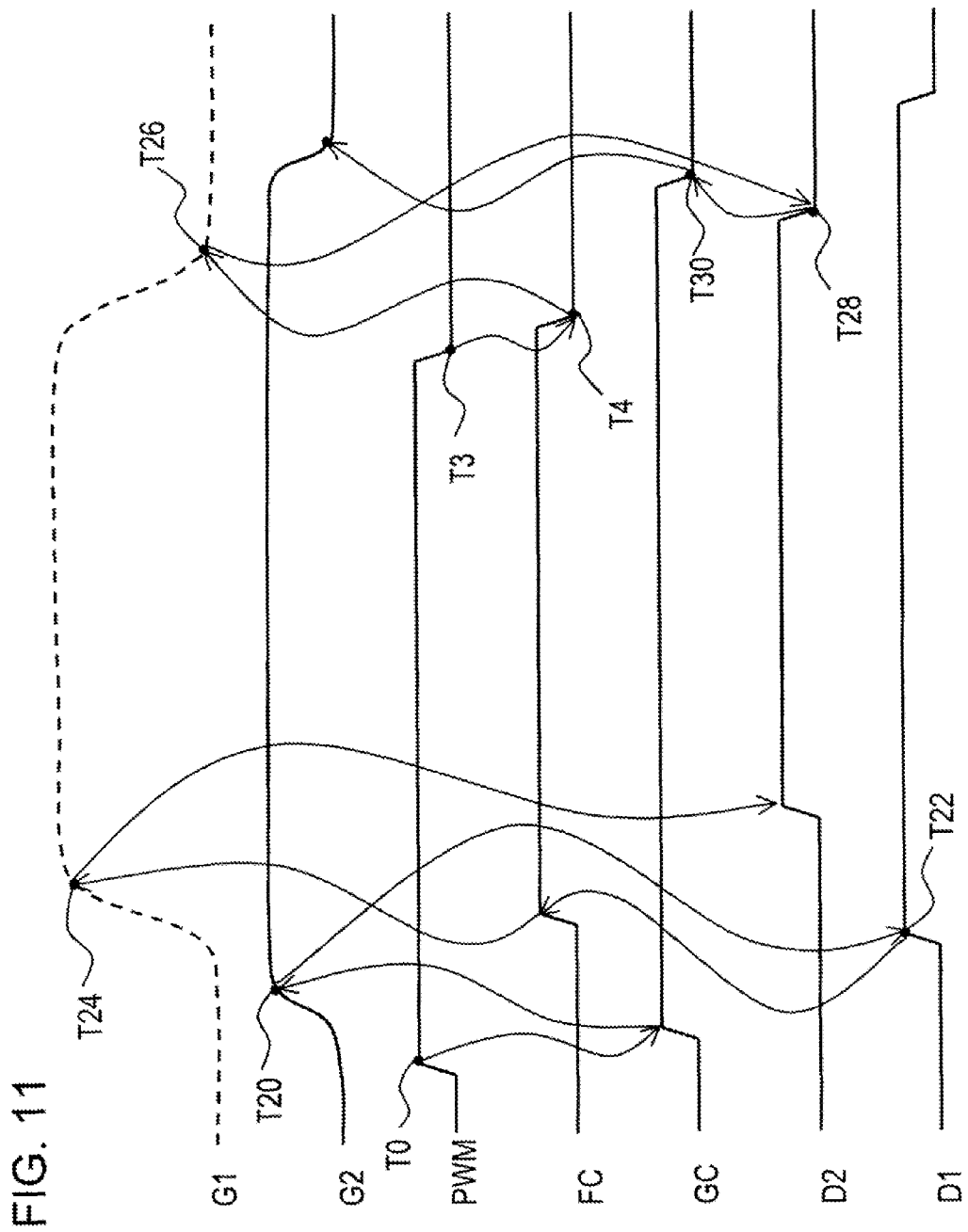
FIG. 11 is a time-chart illustrating an operation of the timing controlling circuit of FIG. 10.

FIG. 10 is a structural drawing for illustrating other example of the timing controlling circuit 40. FIG. 11 is a time chart illustrating operations of the timing controlling circuit of FIG. 10. As illustrated in FIG. 10, this timing controlling circuit includes, for example, a first delay circuit 58a, a second delay circuit 58b, an AND gate 60, and an OR gate 62. Here, a gate driving pulse G2 is provided to an input terminal 66a of the first delay circuit 58a. On the other hand, a FP driving pulse G1 is provided to an input terminal 66b of the second delay circuit 58b.

As illustrated in FIG. 11, when the timing generating pulse (the PWM pulse in FIG. 11) is provided to an input terminal 64, the OR gate 62 generates a gate controlling pulse GC in response to the rising timing T0 of the timing generating pulse. The generated gate controlling pulse GC is provided to the driving circuit 42 at the next stage, via a second output terminal 65b.

In response to the rising timing of this gate controlling pulse GC, the driving circuit 42 at the next stage generates a gate driving pulse G2. In response to a rising timing T20 of this gate driving pulse G2, the first delay circuit 58a generates a first delay pulse D1. In response to a rising timing T22 of this first delay pulse D1, the AND gate 60 generates the FP controlling pulse FC. The generated FP controlling pulse FC is provided to the driving circuit 42 at the next stage, via a first output terminal 65a.

In response to the rising timing of this FP controlling pulse FC, the driving circuit 42 at the next stage generates an FP driving pulse G1. The second delay circuit 58b generates a second delay pulse D2, in response to a rising timing T24 of the FP driving pulse G1.

Thereafter, the timing generating pulse (the PWM pulse) falls low. In response to the falling timing T3 thereof, the AND gate 60 terminates the FP controlling pulse FC. In response to the falling timing T4 of this FP controlling pulse FC, the driving circuit 42 at the next stage terminates the FP driving pulse G1.

In response to a termination timing T26 of this FP driving pulse G1, the second delay circuit 58b terminates the second delay pulse D2. In response to a termination timing T28 of this second delay pulse D2, the OR gate 62 terminates the gate driving pulse GC. In response to a termination timing 30 of this gate driving pulse GC, the driving circuit 42 at the next stage terminates the gate driving pulse G2.

—Driving Circuit—

Figure 12:
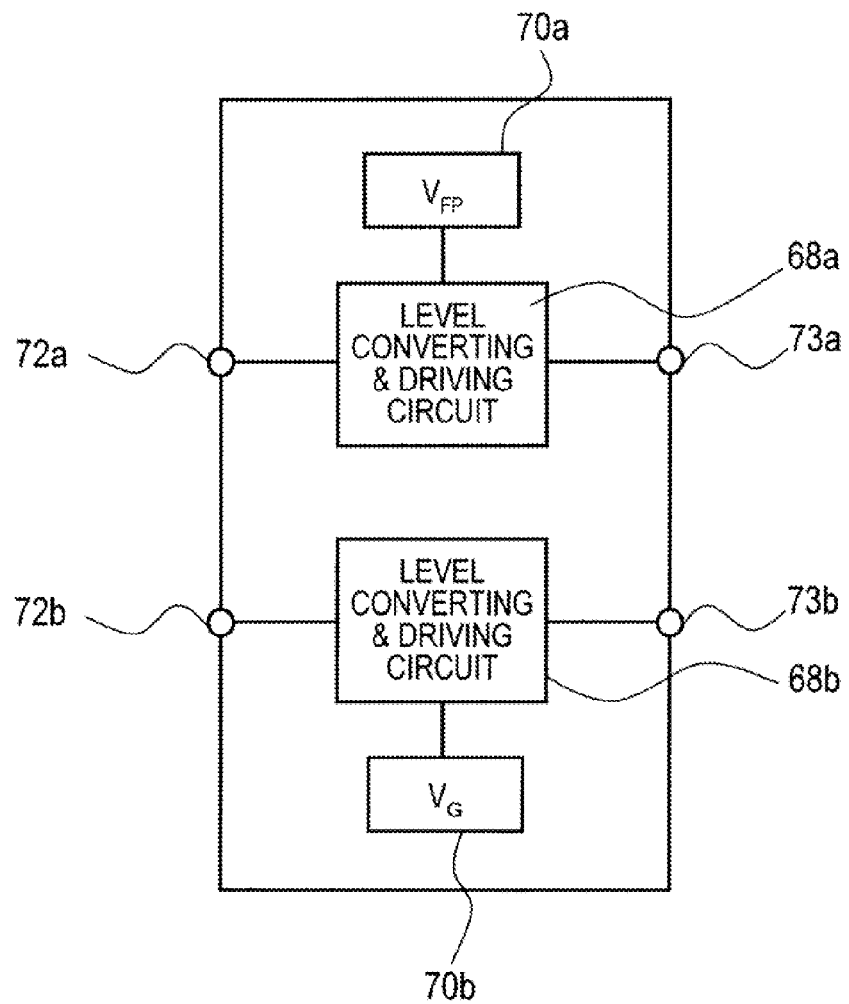
FIG. 12 is an example of a structural drawing of a driving circuit.

FIG. 12 is an example of a structural drawing of the driving circuit 42. This driving circuit includes, as illustrated in FIG. 12, a first level converting & driving circuit 68a, a FP power supply 70a, a second level converting & driving circuit 68b, and the gate power supply 70b.

To a first input terminal 72a connected to the first "level converting & driving circuit" 68a, the FP controlling pulse FC is provided. When the FP controlling pulse FC is provided, the first "level converting & driving circuit 68a" converts the FP controlling pulse FC to the FP driving pulse G1. The peak value of the FP driving pulse G1 is a voltage VFP (for example, 50 V), which the FP power supply 70a supplies to the first "level converting & driving circuit 68a". The FP driving pulse G1 is provided to the FP 20 of the transistor 4, via a first output terminal 73a.

To a second input terminal 72b connected to the second "level converting & driving circuit" 68b, the gate controlling pulse GC is provided. When the gate controlling pulse GC is provided, the second "level converting & driving circuit" 68b converts the gate controlling pulse GC to the gate driving pulse G2. The peak value of the gate driving pulse G2 is a voltage VG (for example, 10 V), which the gate power supply 70b supplies to the second "level converting & driving circuit" 68b. This gate driving pulse G2 is provided to the gate 18 of the transistor 4, via a second output terminal 73b.

Embodiment 2

Figure 13:
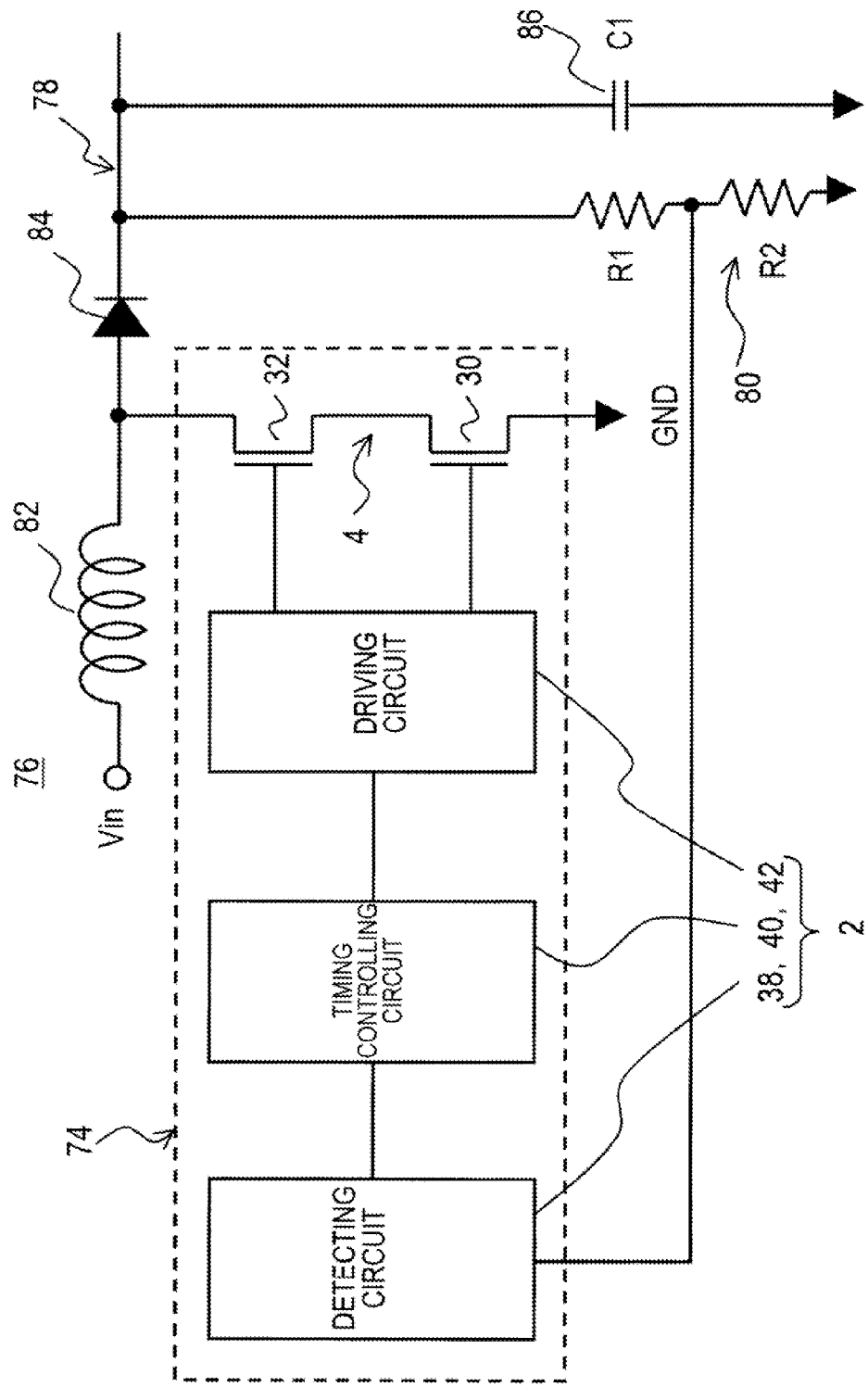
FIG. 13 is a structural drawing of a PFC circuit having the control system in accordance with Embodiment 2.

FIG. 13 is a structural drawing of a PFC (Power Factor Control) circuit 76 including the control system 74 of the present embodiment. As illustrated in FIG. 13, the PFC circuit 76 of the present embodiment includes a control system 74, an exciting circuit 78, and a feedback circuit 80.

The control system 74 includes the control circuit 2 and the transistor 4. The control circuit 2 and the transistor 4 are explained above in Embodiment 1. The exciting circuit 78 includes an inductor 82, a diode 84, and a capacitor 86. The feedback circuit 80 includes a first resistor R1 and a second resistor R2.

To an input terminal Vin of the exciting circuit 78, an input power supply is connected. As an input power supply, a constant voltage supply, an alternating power supply, a rectifying power supply which generates rectified voltage, or the like may be provided. For example, voltage of the input power supply is 100 V. The exciting circuit 78 charges the capacitor 86. The PFC circuit 76 outputs voltages occurring between the both ends of the charged capacitor 86 (hereafter, referred to as output voltages).

The feedback circuit 80 divides this output voltage, and feeds it back to the detecting circuit 38 of the controlling apparatus 2. The detecting circuit 38 compares the fed-back voltage with a voltage (for example, 380V×R2/(R1+R2)) corresponding to the target voltage (for example, 380 V). If the fed-back voltage is lower than the voltage corresponding to the target voltage, the detecting circuit 38 generates a timing generating pulse (for example, the PWM pulse). The width of the PWM pulse is adjusted by, for example, the difference between the voltage corresponding to a target voltage (for example, 380 V) and the fed-back voltage. In response to this PWM pulse, the timing controlling circuit 40 and the driving circuit 42 make the transistor 4 conductive.

When the transistor 4 is made to be conductive, the input power supply is connected to the ground via the inductor 82. As a result, the current flows through the inductor 82, and magnetostatic energy is stored in the inductor 82. Then, when the transistor 4 is made to be non-conductive, the capacitor 86 is charged by the electromagnetic energy stored in the inductor 82. Therefore, the output voltage of the PFC circuit 76 is maintained at around the target voltage.

As explained in the Embodiment 1, according to the control system 74, the ON-resistance of the transistor 4 is reduced. As a result, electric power loss of the transistor 4 is reduced. Therefore, by this control system 74, power conversion efficiency of the PFC circuit is enhanced.

Incidentally, as control methods of an output voltage of the PFC circuit, there are various kinds beside the above. For example, the detecting circuit 38 detects a timing at which the output voltage of the PFC circuit becomes equal to or less than the minimum target voltage (for example, 375 V), and repeatedly generates the PWM pulses. Thereafter, the detecting circuit 38 terminates the generation of the PWM pulse, at the timing when the output voltage exceeds the maximum target voltage (for example, 385 V). The timing controlling circuit 40 and the driving circuit 42 make the transistor 4 conductive, in response to the PWM pulse which the detecting circuit 38 generates. By this control, the output voltage of the PFC circuit 76 is held between the minimum target voltage and the maximum target voltage.

Embodiment 3

Figure 14:
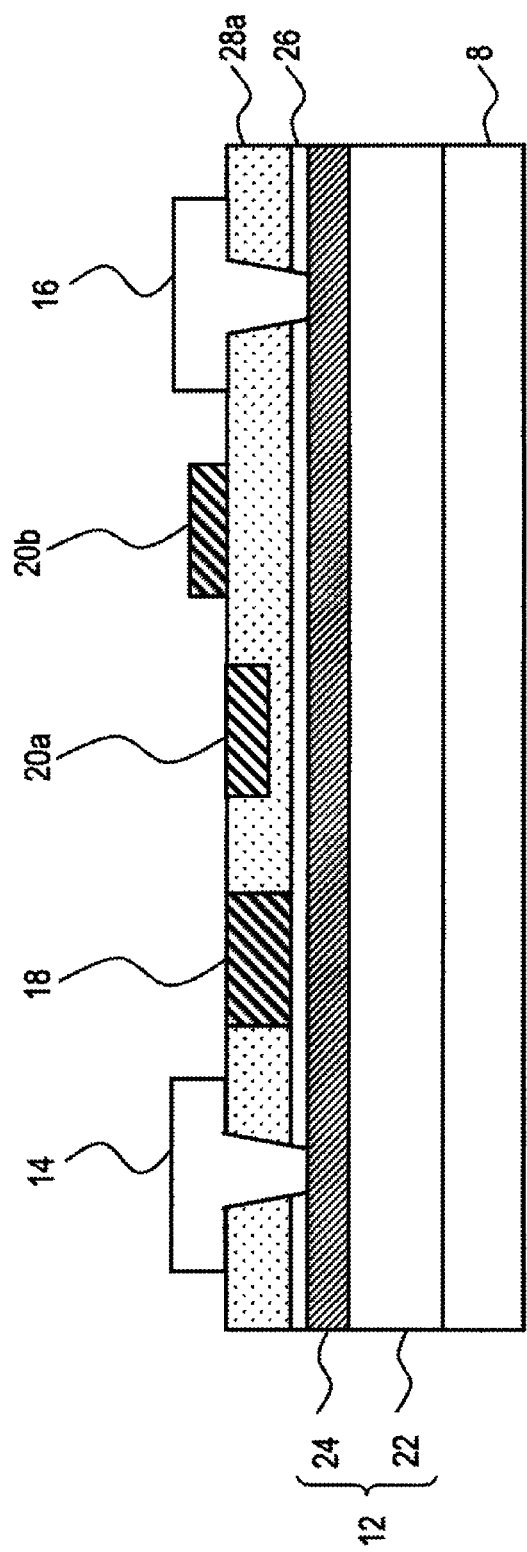
FIG. 14 is a cross-section drawing of a transistor of the control system in accordance with Embodiment 3.
Figure 15:
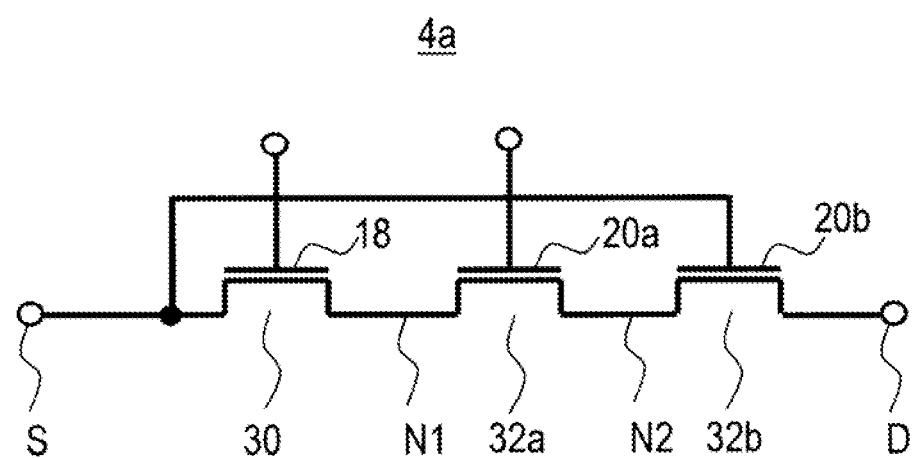
FIG. 15 illustrates an equivalent circuit of a transistor in accordance with Embodiment 3.

This embodiment relates to a control system including a transistor different from that of Embodiment 2. FIG. 14 is a cross-section drawing of the transistor 4a in the control system of this embodiment. FIG. 15 is an equivalent circuit of the transistor 4a. As illustrated in FIG. 14, the transistor 4a includes a first FP 20a and a second FP 20b.

Therefore, the equivalent circuit of the transistor 4a (see FIG. 15) includes a GaN-HEMT 30, a first FP transistor 32a, and a second FP transistor 32b. The GaN-HEMT 30, the first FP transistor 32a, and the second FP transistor 32b respectively correspond to the gate 18, the first FP 20a, and the second FP 20b.

To the gate 18, the gate driving pulse which the control circuit 2 generates is provided. Also, to the first FP 20a, the FP driving pulse which the control circuit 2 generates is provided. On the other hand, to the second FP 20b, the source S of the transistor 4a is connected (see FIG. 15).

The threshold value of the GaN-HEMT 30 is, for example, approximately 1-3 V. The threshold value of the first FP transistor 32a is a negative voltage (for example, approximately −10 V). The threshold value of the second FP transistor 32b is a negative voltage (for example, approximately −40 V) which is lower than the threshold value of the first FP transistor 32a.

By providing the second FP transistor 32b, the drain potential of the first FP transistor 32a (the potential of a node N2) is made to be a potential (for example, 40 V) which is lower than the potential of a drain D of the transistor 4a (for example, 380 V). Therefore, insulating films 28a, 26 beneath the first FP 32a are made to be thinner. Therefore, the ON-resistance of the first FP transistor 32a is made to be lower.

Also, since the drain potential of the first FP transistor 32a (the potential of the node N2) becomes lower, the length of the first FP 32a (the length toward the travel direction of electron) is shortened. Thereby, the capacitance of the first FP 32a becomes smaller, and the switching speed of the transistor 4a becomes faster.

Other structures and operations are substantially the same as the transistors 4 in accordance with Embodiments 1 and 2. Also, the control circuit is the same as the control circuits 2 of the embodiments 1 and 2.

In the embodiments above, the transistors 4, 4a are high-electron-mobility compound semiconductor transistors including GaN/AlGaN heterojunction. However, the transistors 4, 4a may be other high-electron-mobility compound semiconductor transistors. For example, the transistors 4, 4a may be a high-electron-mobility compound semiconductor transistor including GaAs/AlGaAs heterojunction.

Or, in the above embodiments, the controlling pulse which the detecting circuit 38 generates is a PWM pulse. However, the detecting circuit 38 may generate other controlling pulses. For example, the detecting circuit 38 may generate a PFM (Pulse Frequency Modulation) pulse.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A control circuit which controls a transistor including a gate and a field plate, the control circuit comprising:
   a detecting circuit which detects a driving timing to drive the transistor;
   a timing controlling circuit which controls a first driving timing to drive the gate and a second driving timing to drive the field plate, in response to the driving timing; and
   a driving circuit which drives the gate in response to the first driving timing, and drives the field plate in response to the second driving timing.

2. The control circuit according to claim 1, wherein
   the detecting circuit detects a conducting timing to make the transistor conductive as the driving timing; and
   the timing controlling circuit generates the first driving timing and the second driving timing which is later than the first driving timing, in response to the conducting timing.

3. The control circuit according to claim 1, wherein
   the detecting circuit further generates a termination timing to terminate the driving of the transistor;
   the timing controlling circuit further controls a first termination timing to terminate the driving of the gate and a second termination timing to terminate the driving of the field plate, in response to the termination timing; and
   the driving circuit terminates the driving of the gate in response to the first termination timing, and terminates the driving of the field plate in response to the second termination timing.

4. The control circuit according to claim 3, wherein
   the detecting circuit generates a non-conducting timing to make the transistor non-conductive as the termination timing;
   the timing controlling circuit generates the second termination timing and the first termination timing which is later than the second termination timing, in response to the non-conducting timing.

5. The control circuit according to claim 1, wherein
   the driving circuit drives the field plate by a voltage which is higher than a driving voltage of the gate.

6. The control circuit according to claim 1, wherein
   the transistor includes a high-electron-mobility compound semiconductor transistor.

7. A control system of a transistor comprising:
   a transistor including a gate and a field plate;
   a detecting circuit which detects a driving timing to drive the transistor;
   a timing controlling circuit which controls a first driving timing to drive the gate and a second driving timing to drive the field plate, in response to the driving timing; and
   a driving circuit which drives the gate in response to the first driving timing, and drives the field plate in response to the second driving timing.

8. The control system of the transistor according to claim 7, wherein
   the detecting circuit detects a conducting timing to make the transistor conductive as the driving timing; and
   the timing controlling circuit generates the first driving timing and the second driving timing which is later than the first driving timing, in response to the conducting timing.

9. The control system of the transistor according to claim 7, wherein
   the detecting circuit further generates a termination timing to terminate the driving of the transistor;
   the timing controlling circuit further controls a first termination timing to terminate the driving of the gate and a second termination timing to terminate the driving of the field plate, in response to the termination timing; and
   the driving circuit terminates the driving of the gate in response to the first termination timing, and terminates the driving of the field plate in response to the second termination timing.

10. The control system of the transistor according to claim 9, wherein
    the detecting circuit generates a non-conducting timing to make the transistor non-conductive as the termination timing;
    the timing controlling circuit generates the second termination timing and the first termination timing which is later than the second termination timing, in response to the non-conducting timing.

11. The control system of the transistor according to claim 7, wherein
    the driving circuit drives the field plate by a voltage which is higher than a driving voltage of the gate.

12. A method for controlling a transistor including a field plate and a gate, the method comprising
    driving the field plate and the gate at different timings.

13. The method for controlling the transistor according to claim 12, further comprising
    starting the driving of the field plate after starting the driving of the gate.

14. The method for controlling the transistor according to claim 12, further comprising
    terminating the driving of the gate after terminating the driving of the field plate.

15. The method for controlling the transistor according to claim 12, further comprising
    driving the field plate by a voltage higher than a driving voltage of the gate.

16. A device comprising:
    a composite semiconductor-based transistor;
    a first terminal coupled to a gate of the composite semiconductor-based transistor; and
    a second terminal coupled to a field plate of the composite semiconductor-based transistor;
    wherein the first terminal and the second terminal are capable of being driven independently from outside.

* * * * *